United States Patent
Male et al.

(10) Patent No.: US 10,424,551 B2
(45) Date of Patent: *Sep. 24, 2019

(54) INTEGRATED CIRCUIT WAVE DEVICE AND METHOD

(71) Applicant: TEXAS INSTRUMENTS INCORPORATED, Dallas, TX (US)

(72) Inventors: Barry Jon Male, West Granby, CT (US); Benjamin Cook, Addison, TX (US); Robert Alan Neidorff, Bedford, NH (US); Steve Kummerl, Carrollton, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/913,497

(22) Filed: Mar. 6, 2018

(65) Prior Publication Data

US 2018/0197830 A1 Jul. 12, 2018

Related U.S. Application Data

(63) Continuation of application No. 15/395,456, filed on Dec. 30, 2016, now Pat. No. 9,929,110.

(51) Int. Cl.
*H01L 23/66* (2006.01)
*H01L 23/31* (2006.01)
(Continued)

(52) U.S. Cl.
CPC .............. *H01L 23/66* (2013.01); *G02B 3/08* (2013.01); *G02B 19/0014* (2013.01);
(Continued)

(58) Field of Classification Search
CPC ... H01L 2924/1461; H01L 2224/83002; H01L 2224/85002; H01L 23/66; H01L 23/3121;
(Continued)

(56) References Cited

U.S. PATENT DOCUMENTS

| 3,508,126 A | 4/1970 | Newman |
| 3,952,265 A | 4/1976 | Hunsperger |

(Continued)

FOREIGN PATENT DOCUMENTS

| EP | 1986297 A2 | 10/2008 |
| EP | 2490263 A2 | 8/2012 |

(Continued)

OTHER PUBLICATIONS

International Search Report for PCT/US2017/068983 dated May 17, 2018.

(Continued)

*Primary Examiner* — Syed I Gheyas
(74) *Attorney, Agent, or Firm* — Michael A. Davis, Jr.; Charles A. Brill; Frank D. Cimino

(57) ABSTRACT

In described examples of forming an integrated circuit wave device, a method includes: (a) affixing an integrated circuit die relative to a substrate; (b) creating a form relative to the integrated circuit die and the substrate; and (c) forming a wave shaping member having a shape conforming at least in part to a shape of the form.

22 Claims, 8 Drawing Sheets

(51) Int. Cl.
*H01L 21/56* (2006.01)
*G02B 27/09* (2006.01)
*G02B 3/08* (2006.01)
*G02B 19/00* (2006.01)

(52) U.S. Cl.
CPC ..... *G02B 19/0023* (2013.01); *G02B 19/0076* (2013.01); *G02B 27/0955* (2013.01); *G02B 27/0977* (2013.01); *H01L 21/56* (2013.01); *H01L 23/3121* (2013.01)

(58) Field of Classification Search
CPC ....... H01L 21/56; G02B 3/08; G02B 27/0977; G02B 27/0955
See application file for complete search history.

(56) References Cited

U.S. PATENT DOCUMENTS

| | | |
|---|---|---|
| 4,007,978 A | 2/1977 | Holton |
| 4,267,484 A | 5/1981 | O'Loughlin |
| 4,272,753 A | 6/1981 | Nicolay |
| 4,891,730 A | 1/1990 | Saddow et al. |
| 4,916,506 A | 4/1990 | Gagnon |
| 4,996,577 A | 2/1991 | Kinzer |
| 5,340,993 A | 8/1994 | Salina et al. |
| 5,389,578 A | 2/1995 | Hodson et al. |
| 5,514,892 A | 5/1996 | Countryman et al. |
| 5,629,838 A | 5/1997 | Knight |
| 5,796,570 A | 8/1998 | Mekdhanasarn |
| 5,929,514 A | 7/1999 | Yalamanchili |
| 5,990,519 A | 11/1999 | Huang-Lu et al. |
| 6,031,251 A | 2/2000 | Gempe et al. |
| 6,242,987 B1 | 6/2001 | Schopf et al. |
| 6,351,011 B1 | 2/2002 | Whitney et al. |
| 6,365,433 B1 | 4/2002 | Hyoudo et al. |
| 6,507,264 B1 | 1/2003 | Whitney |
| 6,509,574 B2 | 1/2003 | Yuan et al. |
| 6,815,808 B2 | 11/2004 | Hyodo et al. |
| 6,821,822 B1 | 11/2004 | Sato |
| 6,977,468 B1 | 12/2005 | Baginski |
| 7,015,587 B1 | 3/2006 | Poddar |
| 7,321,162 B1 | 1/2008 | Lee et al. |
| 7,334,326 B1 | 2/2008 | Huemoeller et al. |
| 7,732,892 B2 | 6/2010 | Jeng et al. |
| 7,842,542 B2 | 11/2010 | Shim et al. |
| 7,869,180 B2 | 1/2011 | Cheung et al. |
| 8,018,705 B2 | 9/2011 | Michalopoulos et al. |
| 8,433,084 B2 | 4/2013 | Conti |
| 8,436,460 B1 | 5/2013 | Gamboa et al. |
| 8,569,082 B2 | 10/2013 | Kummerl et al. |
| 8,633,551 B1 | 1/2014 | Teh et al. |
| 9,184,012 B2 | 11/2015 | Wang |
| 9,419,075 B1 | 8/2016 | Carothers et al. |
| 9,748,207 B2 | 8/2017 | Krause et al. |
| 9,929,110 B1 * | 3/2018 | Male ................. H01L 23/66 |
| 2003/0183916 A1 | 10/2003 | Heck et al. |
| 2003/0222205 A1 | 12/2003 | Shoji |
| 2004/0080025 A1 | 4/2004 | Kasahara et al. |
| 2004/0084729 A1 | 5/2004 | Leung et al. |
| 2004/0111881 A1 | 6/2004 | Yang et al. |
| 2005/0218300 A1 | 10/2005 | Quinones et al. |
| 2006/0205106 A1 | 9/2006 | Fukuda |
| 2006/0281334 A1 | 12/2006 | Shin et al. |
| 2007/0076421 A1 | 4/2007 | Kogo et al. |
| 2007/0152308 A1 | 7/2007 | Ha et al. |
| 2007/0229177 A1 | 10/2007 | Moriya |
| 2008/0217759 A1 | 9/2008 | Lin et al. |
| 2008/0266730 A1 | 10/2008 | Viborg et al. |
| 2009/0052214 A1 | 2/2009 | Edo et al. |
| 2009/0115049 A1 | 5/2009 | Shiraishi et al. |
| 2009/0127638 A1 | 5/2009 | Kilger et al. |
| 2010/0187652 A1 | 7/2010 | Yang |
| 2010/0252923 A1 | 10/2010 | Watanabe et al. |
| 2011/0089540 A1 | 4/2011 | Drost et al. |
| 2011/0108747 A1 | 5/2011 | Liu |
| 2011/0233790 A1 | 9/2011 | Bchir |
| 2013/0134445 A1 | 5/2013 | Tarsa et al. |
| 2013/0194057 A1 | 8/2013 | Ruby |
| 2013/0315533 A1 | 11/2013 | Tay et al. |
| 2013/0320548 A1 | 12/2013 | Carpenter et al. |
| 2013/0329324 A1 | 12/2013 | Tziviskos et al. |
| 2014/0001632 A1 | 1/2014 | Uehling et al. |
| 2014/0091909 A1 | 4/2014 | Smith et al. |
| 2014/0264905 A1 | 9/2014 | Lee et al. |
| 2015/0035091 A1 | 2/2015 | Ziglioli |
| 2015/0069537 A1 | 3/2015 | Lo et al. |
| 2015/0249043 A1 | 9/2015 | Elian et al. |
| 2015/0255693 A1 | 9/2015 | Baade et al. |
| 2015/0369681 A1 | 12/2015 | Imai |
| 2015/0369682 A1 | 12/2015 | Nakajima |
| 2015/0380353 A1 | 12/2015 | Bauer et al. |
| 2016/0003436 A1 | 1/2016 | Singer |
| 2016/0064696 A1 | 3/2016 | Collier et al. |
| 2016/0103082 A1 | 4/2016 | Kimura |
| 2016/0167089 A1 | 6/2016 | Ng et al. |
| 2016/0209285 A1 | 7/2016 | Nakajima |
| 2017/0089789 A1 | 3/2017 | Kanemoto |
| 2017/0134004 A1 | 5/2017 | Isozaki |
| 2017/0330841 A1 | 11/2017 | Cook et al. |

FOREIGN PATENT DOCUMENTS

| | | |
|---|---|---|
| GB | 2521619 | 1/2015 |
| RU | 2169962 C2 | 6/2001 |
| RU | 2201017 C2 | 3/2003 |
| RU | 2263999 A | 7/2005 |

OTHER PUBLICATIONS

International Search Report for PCT/US2017/068997 dated May 24, 2018.

Cameron G. Clark, "The Basics of Arc Flash," GE Industrial Solutions web site accessed Oct. 5, 2016, http://apps.geindustrial.com/publibrary/checkout/ArcFlash4?TNR=White%20Papers%7CArcFlash4%7Cgeneric (3 pages).

National Semiconductor Corporation, "Semiconductor Packaging Assembly Technology," National Semiconductor Corporation, Aug. 1999, pp. 1-8.

OSRAM Opto Semiconductors GmbH, Oslon Compact (850nm), version 1.6; SFH 4710; dated Dec. 1, 2015; 13 pages.

International Search Report for PCT/US2017/031987 dated Sep. 7, 2017.

Maloberti, F., "Layout of Analog CMOS Integrated Circuit, Part 2 Transistors and Basic Cells Layout," retrieved from http://ims.unipv.it/Courses/download/AIC/Layout02.pdf, dated Mar. 15, 2004 (38 pages).

Texas Instruments Product Brochure ISO7841x High-Performance, 8000-Vpk Reinforced Quad-Channel Digital Isolator, dated Nov. 2014 (37 pages).

Texas Instruments Application Report "The ISO72x Family of High-Speed Digital Isolators," SLLA198—Jan. 2006 (12 pages).

Texas Instruments Developers Guide "Digital Isolator Design Guide," SLLA284A, Jan. 2009 (19 pages).

Wikipedia article "3D Printing," retrieved from "http://en.wikipedia.org/w/index.php?title=3D_printing&oldid=624190184", dated Sep. 4, 2014 (35 pages).

European Search Report for 17796774.2 dated May 9, 2019.

* cited by examiner

INTEGRATED CIRCUIT WAVE DEVICE AND METHOD

CROSS-REFERENCE TO RELATED APPLICATION

This application is a continuation of U.S. patent application Ser. No. 15/395,456 filed Dec. 30, 2016, which is fully incorporated herein by reference.

BACKGROUND

This relates to an integrated circuit wave device and a method of manufacturing it, where the device may be a transmitter, receiver, transceiver, emitter or detector operable in connection with emitting or detecting waves (e.g., electromagnetic waves, pressure waves, etc.), and where the waves may be within a bandwidth selected from various ranges, such as from radio frequency to ultraviolet (i.e., through the visible spectrum and beyond).

Integrated circuit wave devices have myriad functions and applications, and may be generally categorized by virtue of the bandwidth of waves communicated either to, or from, the device. Typically, such a device is formed as an integrated circuit package, with a part of the package including one or more elements for either detecting or emitting a wave. More specifically, an integrated circuit package typically includes one or more semiconductor chips (or "dies") that are affixed relative to one another and to a substrate in some type of casing, which is often a metal, plastic, glass or ceramic, and where the casing inclusive of what it encloses is referred to as a whole as the package. Thus, a die or dies includes the wave transmitting or receiving element(s), hereafter referred to as a communication element. For example, radio frequency (RF) or infrared (IR) communication elements may be used to wirelessly transmit signals, in numerous applications. As another example, IR communication elements may be used in imaging or motion detection. In yet another example, communication elements may be used for power measurements. In any event, the operation and efficacy of the device is based in part on the proper communication of the wave to/from the communication element, so sufficiently directing the wave with respect to the element is important.

A conventional wave directing apparatus, including either lenses or reflectors, may be positioned external from the package, but relative to its communication element. Such lenses or reflectors improve signal strength, such as by focusing waves and also in connection with either sensing directionality or beam forming in a known output direction. Such approaches can improve signal performance, but they also have potential drawbacks. For example, the positioning and affixation of wave directing apparatus requires additional manufacturing steps beyond the construction of the package itself. As another example, components external from the package, including these wave directing apparatus, are more readily susceptible to being damaged or displaced as they are not necessarily protected in the same manner as components encapsulated within the package.

SUMMARY

In described examples of forming an integrated circuit wave device, a method includes: (a) affixing an integrated circuit die relative to a substrate; (b) creating a form relative to the integrated circuit die and the substrate; and (c) forming a wave shaping member having a shape conforming at least in part to a shape of the form.

DETAILED DESCRIPTION OF EXAMPLE EMBODIMENTS

Figure 1:
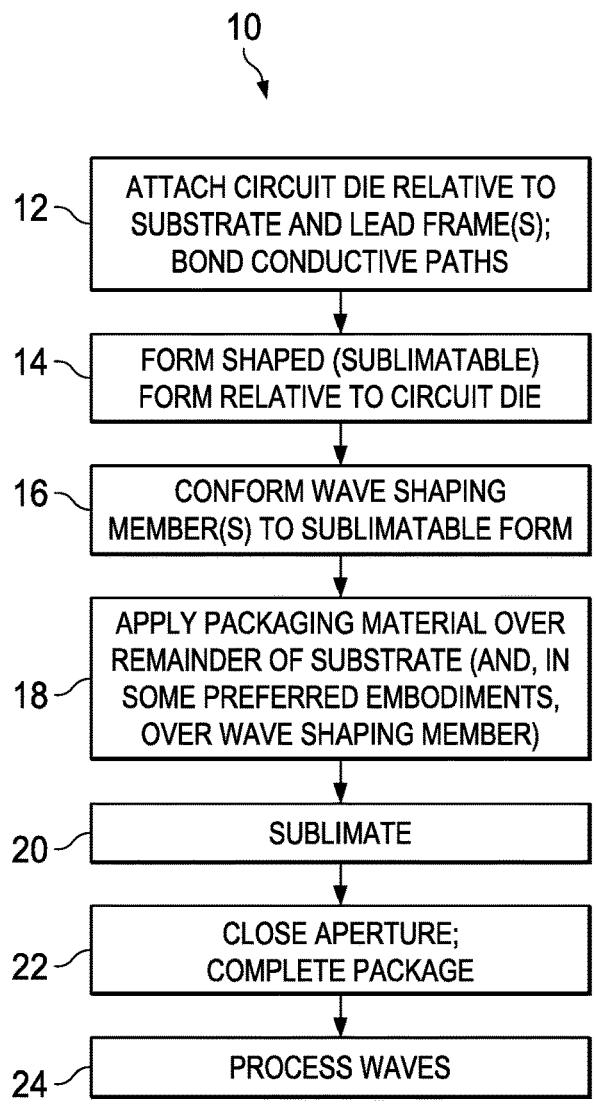
FIG. 1 illustrates an example method for creating and operating a wave device according to example embodiments.

Example embodiments relate to an integrated circuit wave device and the method of manufacturing it. FIG. 1 illustrates various steps of such a method 10, and FIGS. 2A through 7 illustrate the integrated circuit wave device 100 in various views and stages of the product formation. Additional details are described in co-owned U.S. Patent Application Publication No. 2017/0330841, which is hereby incorporated herein by reference.

Figure 2B:
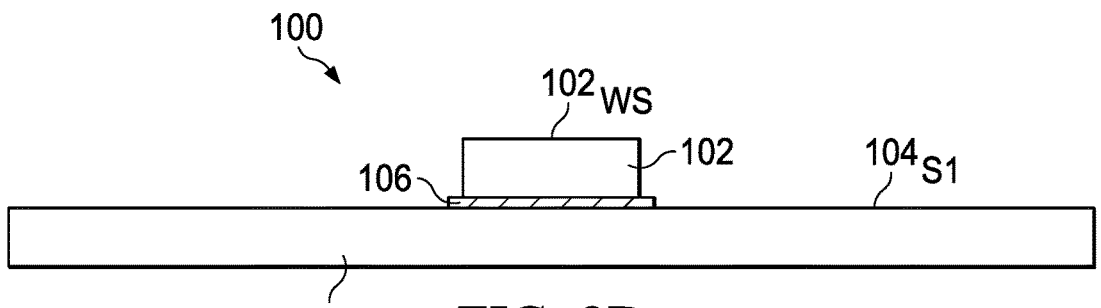
FIG. 2B illustrates a cross-sectional view of FIG. 2A.
Figure 2A:
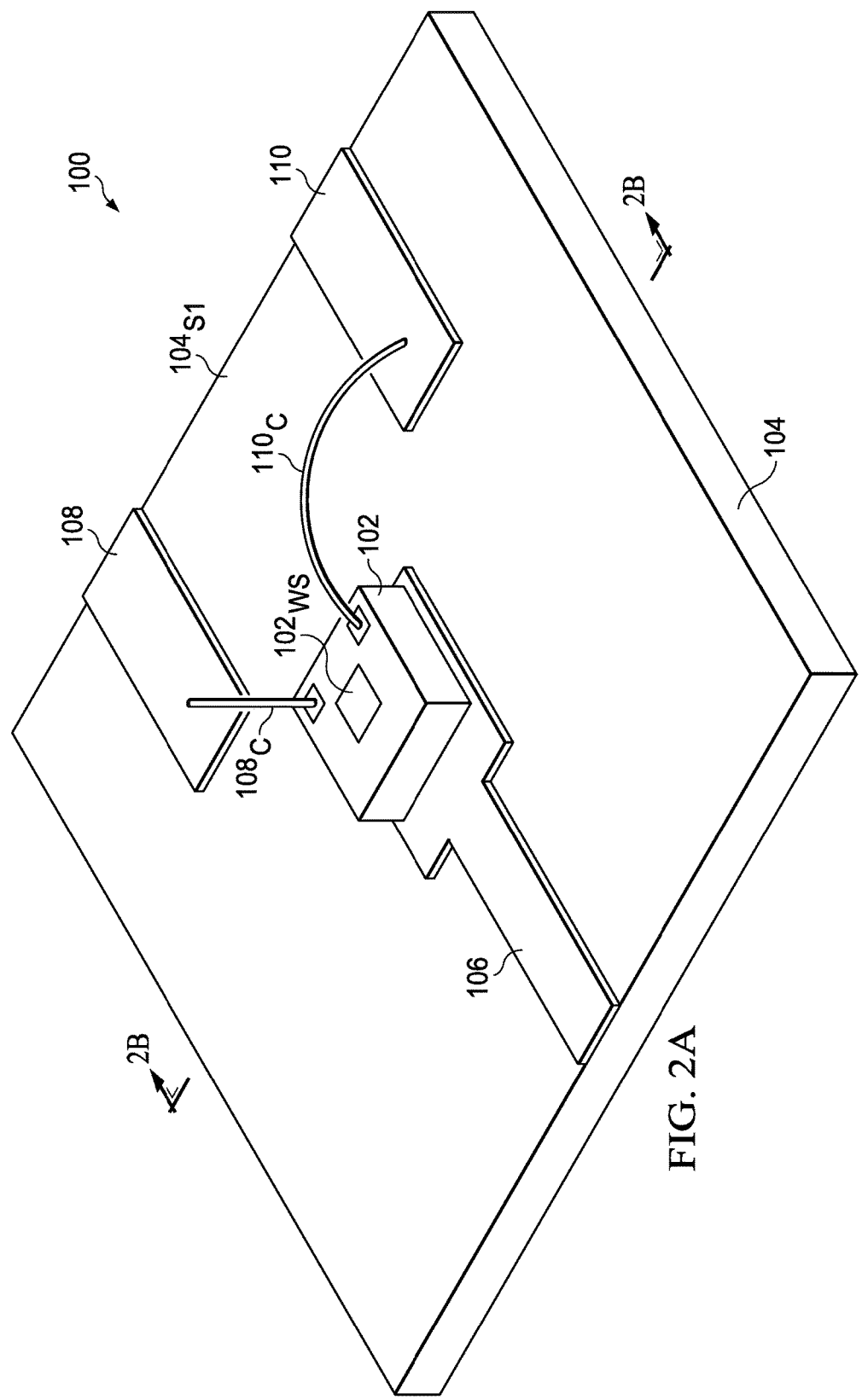
FIG. 2A illustrates a perspective view of various components of a wave device according to one example embodiment.

In FIG. 1, the method 10 is shown with a first step 12, which is necessarily preceded by various additional method steps as known, where the preceding steps form or provide various components that are shown in FIG. 2A. For example, FIG. 2A illustrates a perspective view of various components of wave device 100. In step 12, a circuit die 102 is attached relative to a first surface $104_{S1}$ of a substrate 104. Circuit die 102 may be of various types and, for purposes of example embodiments, it includes apparatus and functionality for either transmitting/emitting or receiving/detecting (or both) a wave (i.e., either a signal or noise), the wave being of a particular device bandwidth referred to herein as $BW_D$. Accordingly, for example, die 102 is shown to include a wave surface $102_{WS}$ for either transmitting/emitting or receiving/detecting the wave. One die with one communication surface is shown and described, but alternative embodiments may include either multiple die (e.g., in an array) or multiple communication surfaces per the one or more die.

Substrate 104 is constructed of various materials, and one consideration is that the material of substrate 104 be selected in anticipation of the type and/or bandwidth $BW_D$ of the wave that is communicated relative to device 100. Specifically, the substrate 104 material is selected to readily permit the wave to transmit through substrate 104 with little or no change in the signal direction or strength, so the substrate material does not have strong absorbance (i.e., at most a negligible effect) in the bandwidth $BW_D$ of interest so that a substantial portion of the wave passes through the material. For example, where the bandwidth $BW_D$ is in the visible spectrum because the anticipated wave is visible light, then preferably the material for substrate 104 is transparent to the passage of the signal (i.e., the light). Such transmission of the wave signal through the material of substrate 104 is desired, so as to ultimately be communicated to/from wave surface $102_{WS}$.

The attachment of step 12 may be of various techniques and may involve additional structure, with FIG. 2A illustrating one example. For example, a first lead frame 106 is affixed to an upper surface of substrate 104. Step 12 affixes circuit die 102 so that it is adjacent lead frame 106, as further shown in FIG. 2B. Specifically, FIG. 2B illustrates a cross-sectional view of FIG. 2A (along line 2B therein), from which it is apparent that lead frame 106 is between a first surface $104_{S1}$ of substrate 104 and die 102. As further shown in FIG. 2A, additional lead frames 108 and 110 may be affixed to substrate 104, where these lead frames provide electrical connectivity points relative to die 102. Also, for example, step 12 includes the connection of conductors $108_C$ and $110_C$ (e.g., bond wires) as between each lead frame 108 and 110 to a respective conductive pad on die 102.

Figure 3A:
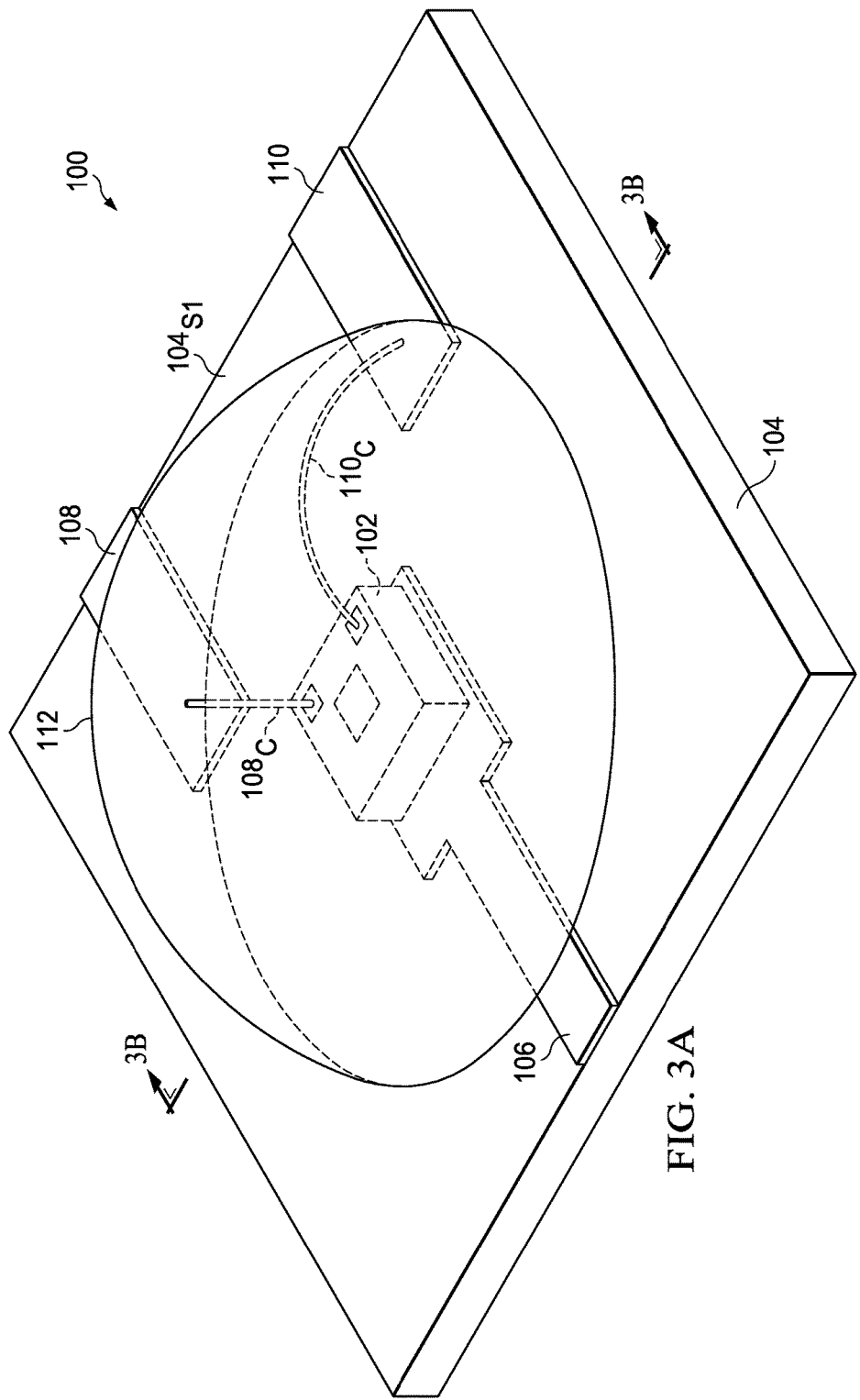
FIG. 3A illustrates the perspective view of FIG. 2A after additional processing.
Figure 3B:
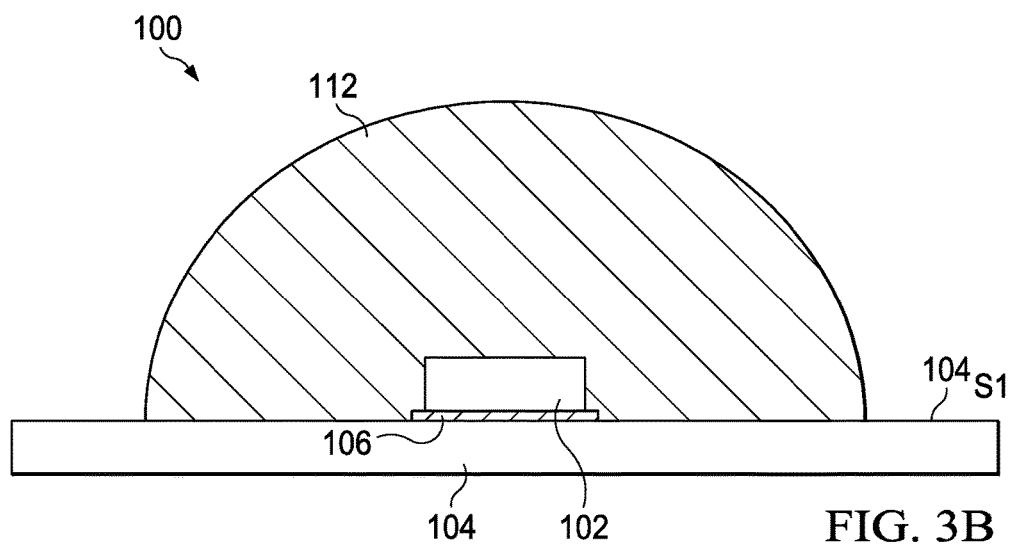
FIG. 3B illustrates a cross-sectional view of FIG. 3A.

Referring again to FIG. 1 and method 10, a step 14 follows step 12. In step 14, a shaped material form is formed relative to a region of circuit die 102. In various example embodiments, the shaped form is created using a sublimatable material, which is a material that may be subsequently sublimated, whereas alternative may be used in other embodiments as described hereinbelow. For the use of a sublimatable material, and as detailed in the above-incorporated U.S. Patent Application Publication No. 2017/0330841, materials such as various types of polyols can sublimate or shrink/delaminate at temperatures outside the wire bonding process windows and molding process windows (described hereinbelow). In that earlier patent application, such sublimation leaves a cavity within the package, so as to alleviate certain structural stresses. In contrast, and as described hereinbelow in various example embodiments, the sublimatable material provides a sublimatable form, where the term "form" is used in the sense of comparable structures (such as a mold, cast, shape or matrix), because the form provides a precursor shape for forming an adjacent structure next to (or otherwise in conformance with at least a portion of the shape of) the form, as further described hereinbelow. With respect to step 14, FIG. 3A repeats the perspective view illustration of FIG. 2A, and FIG. 3B repeats the cross-sectional view illustration of FIG. 2B, but after the step 14 form described in FIG. 1 is formed. In the example of FIG. 3A, the step 14 form is shown as a hemispherical form 112. Preferably, hemispherical form 112 fully surrounds circuit die 102 (items covered by form 112 are shown with dashed lines in FIG. 3A), and otherwise is formed in part above lead frames 106, 108 and 110, thereby also covering conductors $108_C$ and $110_C$. Depending on the physical/chemical properties of the polyols and applicable process temperature windows, the selected sublimatable materials for form 112 may be applied as solids that can be extruded as a melting bead at certain temperatures for depositing over select portions of the die/substrate/bond wires. In another variation, the sublimatable materials may be dissolved in suitable solvents and applied as a solution of appropriate viscosity using a syringe dispensing mechanism that dispenses a bead over the die portions and surrounding substrate and bond wire portions (hereinafter referred to as "encapsulated components"). The solvent may be evaporated from the bead, thereby leaving a "glob" of the material over the circuit die 102. In yet another variation, a select sublimatable material may be applied as a liquid at room temperature, whereupon it may be cured by radiation (e.g., UV, IR, etc.) that creates cross-linking of chemical bonds to solidify as a bump. Also, the step 14 application or completion of hemispherical form 112, insofar as its sublimatable material is concerned, may involve a heat (e.g., cure/bake) stage or stages.

Referring again to FIG. 1 and method 10, a step 16 follows step 14. In step 16, a conforming wave shaping member (or plural members) is formed adjacent part or all of the sublimatable form created in step 14. For ease of illustration, a perspective view is not shown, but FIG. 4 again illustrates the cross-sectional side view of FIG. 3B, with the addition of a wave shaping member 114 (as created in step 14) formed adjacent sublimatable form 112. In the illustrated example, wave shaping member 114 is hemispherical, so at least the inner edge of wave shaping member 114 conforms to a part or all of the shape of form 112, and therefore it provides an inner concave surface $114_{1CS}$ (and preferably parabolic) relative to integrated circuit die 102. Thus, in the illustrated example, wave shaping member 114 may be created by a conforming layer having a thickness, preferably uniform, positioned atop the entirety of sublimatable form 112. Further, member 114 is referred to as "wave shaping" because the material used for member 114 is preferably one suited for altering the directionality of waves at the bandwidth $BW_D$. Accordingly, for example, if the bandwidth $BW_D$ is within the visible spectrum, then the material used for wave shaping member 114 is reflective to that spectrum, so that light impinging on the inner concave surface of member 114 will reflect inwardly in the direction of die 102. In this manner, the change in wave directionality is "wave shaping," as further described hereinbelow.

Figure 4:
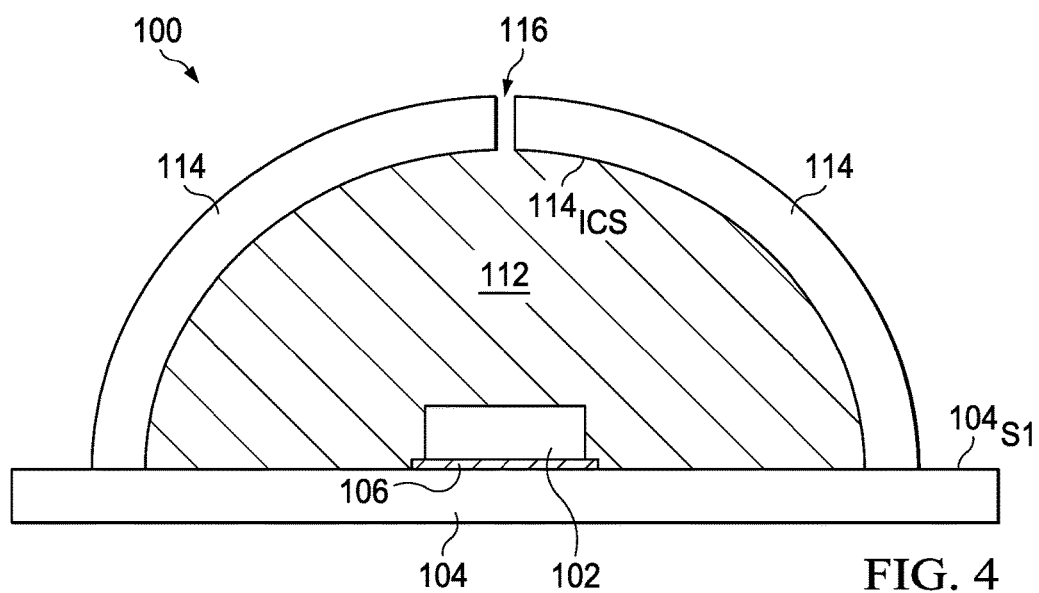
FIG. 4 illustrates the cross-sectional view of FIG. 3B after additional processing.

In another aspect of step 16 and wave shaping member 114, and in an example embodiment, an aperture 116 (or multiple apertures) is/are created through member 114, so as to allow an air channel between the exterior of member 114 and the sublimatable material of sublimatable form 112. For example, FIG. 4 shows a single aperture 116 located near or at the upper apex of the curvature of member 114. The diameter of aperture 116 also may be selected, such as in a range of 0.1 to 100's of wavelengths. Aperture 116 is shown as part of the step 16 formation of the wave shaping member(s) but, in an alternative embodiment, the aperture(s) can be formed as a separate step, after forming the wave shaping member, such as cutting, drilling and the like, and with various tools for doing so (e.g., laser).

Figure 5:
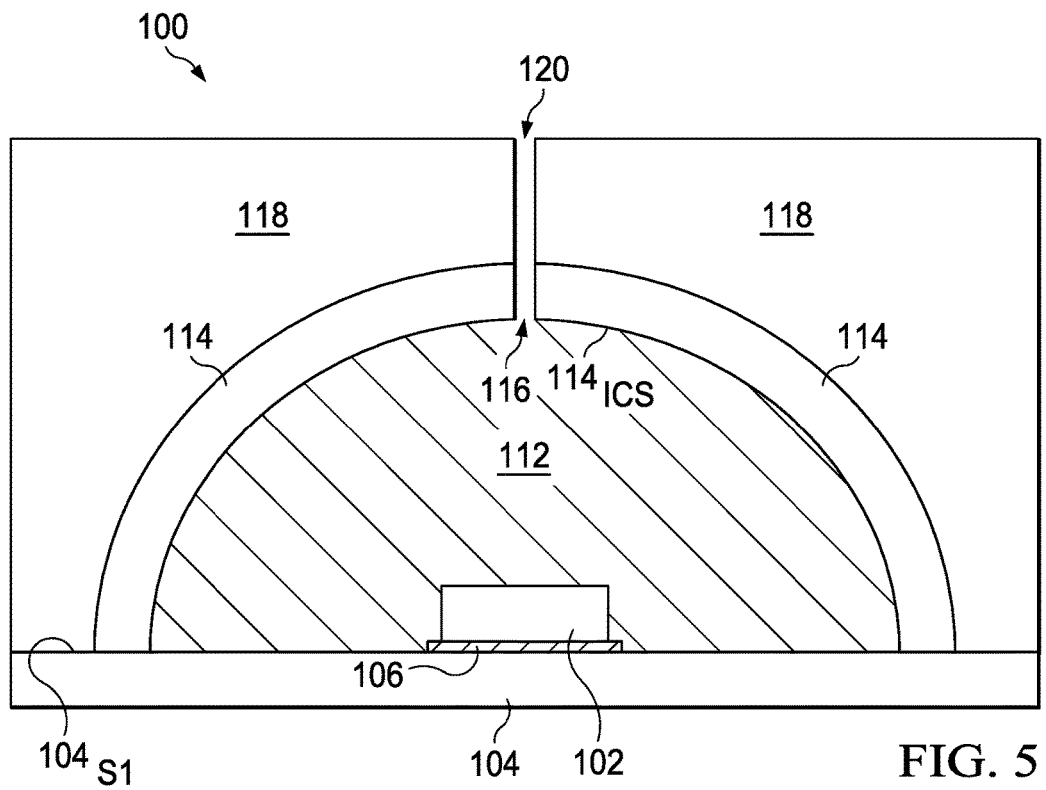
FIG. 5 illustrates the cross-sectional view of FIG. 4 after additional processing.

Referring again to FIG. 1 and method 10, a step 18 follows step 16. In step 18, an integrated circuit packaging material is applied over the device, preferably so as to encapsulate wave shaping member 114 and the remainder of the components affixed to substrate 104. For this step, FIG. 5 illustrates the cross-sectional side view of FIG. 4, with the addition of an encapsulating mold 118, formed according to step 18 by applying a select molding material over the desired circuit components. Additional steps may be required in connection with integrated circuit packaging. The molding materials may be selected from plastics, epoxy resins, etc. that may be formulated to contain various types of inorganic fillers, such as fused silica, catalysts, flame retardants, stress modifiers, adhesion promoters and other additives, preferably based on the specific product/part requirements, although other types of molding/packaging materials also may be used. In one example implementation, the select molding material may be applied by a packaging tool having a needle that is brought into contact with the wave shaping member 114, whereupon the select molding material is deposited around the needle, thereby also creating at least one aperture 120 in fluid (e.g., air) communication with aperture 116, where aperture 120 preferably has a dimension comparable to aperture 116. Usually, intense heat may be applied to the molding material, which may be liquefied and shaped into the desired structure. Also, the select molding material having aperture 120 may be cured in one or more stages in a mold cure process. In another example, film assist molding may be used, so a film (or two films) is/are subjected to a vacuum, so as to conform to a separable mold form and to thereby define a region into which thereafter a molding material is filled, so the film therefore isolates the mold from the molding material. Thus, after the molding material cures, the mold form is separable, so as to release the encapsulated device that cured in the region, with the film having kept clean the mold form surfaces. In any event, with this process, aperture 120 may be realized as part of the film-protected mold form. Yet another example may use injection molding of many devices at once as an array or large contiguous mass, followed by sawing or other technique to separate individual devices from the mold.

Figure 6:
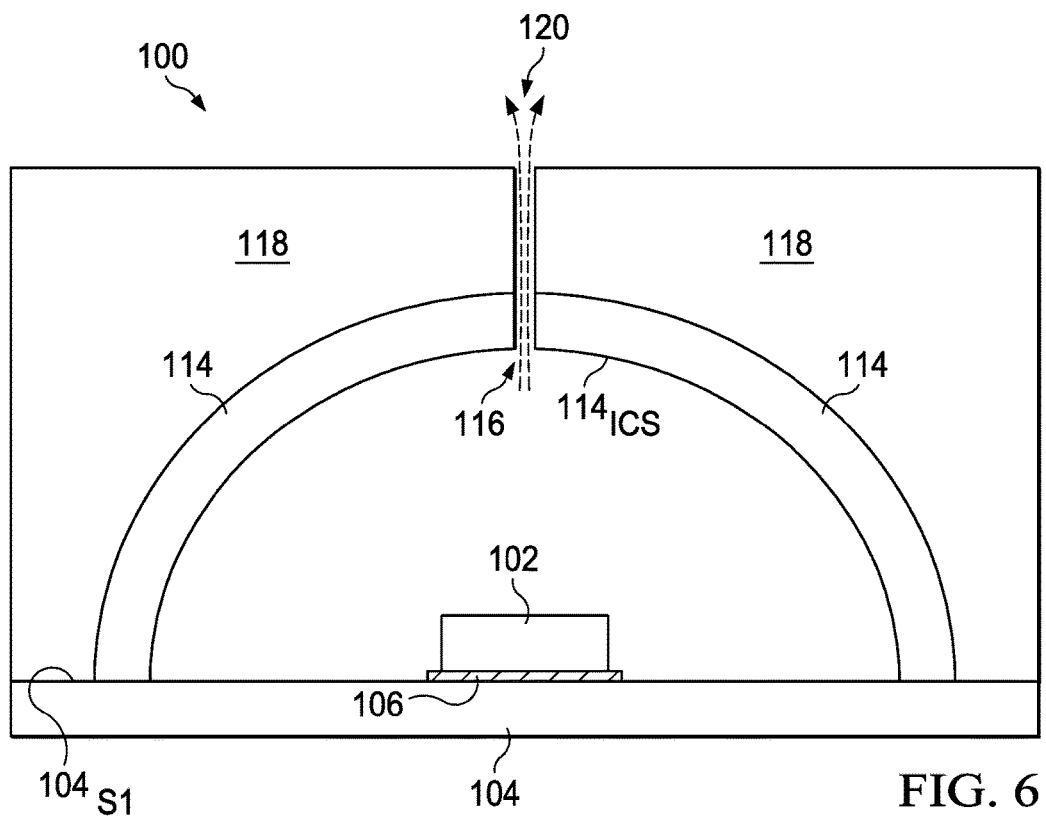
FIG. 6 illustrates the cross-sectional view of FIG. 5 after additional processing.

Referring again to FIG. 1 and method 10, a step 20 follows step 18. In step 20, the sublimatable material from step 14 is sublimated, so the material is exposed to proper processes so as to transition the substance directly from the solid to the gas phase without passing through the intermediate liquid phase. For this step, FIG. 6 illustrates the cross-sectional side view of FIG. 5, where the patterned fill of the former material 112 in above-described Figures (i.e., from inside the concave shape of member 114) is shown as gone, so as to represent: the phase change of the substance to gas; and, as a result of the sublimation processes, the resultant sublimated gas is exhausted through apertures 116 and 120, as shown by dotted arrows in the Figure. In view of the steps and structure described hereinabove, an interior cavity remains on the concave side of wave shaping member 114, which may be occupied generally by the ambient material (e.g., air) remaining after the sublimated gas is exhausted from that area. The sublimation may be achieved in various ways consistent with the type of sublimatable material used in in the above-described step 14. For example, heat, radiation or other phase-change energy or process(es) may be applied to gasify the sublimatable material of hemispherical form 112 at suitable temperatures (i.e., sublimation/evaporation), such as relative to usual backend packaging flow conditions.

Before proceeding, step 20 may be modified or omitted if a non-sublimatable material or materials is/are used for the step 14 formation of a shaped form. For example, the material used for the form in alternative embodiments may be of a type that responds to a treatment (e.g., heat), so part of the material sublimates directly from solid phase to gas, while other parts transition from solid to liquid in step 20 so as to be removable (e.g., by flowing) through apertures 116 and 120, again as shown by dotted arrows in the FIG. 6. As yet another alternative, step 20 (and others pertaining to aperture creation and closure) may be eliminated entirely in an alternative embodiment, wherein the step 14 form is created by a material that remains solid and is not removed via an aperture, which would be achieved by substituting in step 14 a material that remains as part of the final package and is of a type that does not substantially attenuate the bandwidth $BW_D$ of interest (e.g., clear polymer, where the bandwidth $BW_D$ is visible light).

Figure 7:
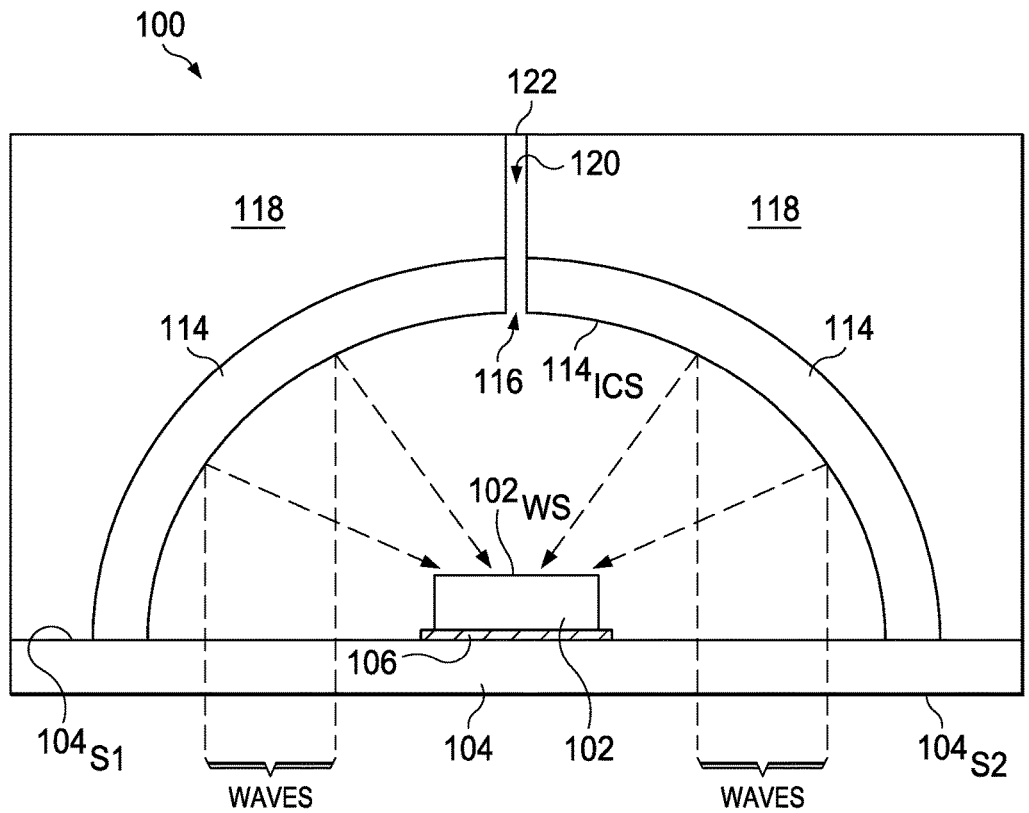
FIG. 7 illustrates the cross-sectional view of FIG. 6 after additional processing and in an operational illustration.

Referring again to FIG. 1 and method 10, a step 22 follows step 20. In step 22, a cover, seal or other closure is formed over the step 18 aperture of the packaging material. For this step, FIG. 7 illustrates the cross-sectional side view of FIG. 6, where a cover 122 is formed over aperture 120, thereby enclosing any open area within the concavity of wave shaping member 114. Cover 122 may be formed in various ways. For example, aperture 120 may be covered or otherwise sealed with a film layer, such as one comprising a B-stage film or screen-printed encapsulant layer, and selection of a particular film layer to seal the package may depend on the size or shape of aperture 120. Generally, step 22 completes the packaging of wave device 100, although additional processes could be added.

Referring to FIG. 1, the final step 24 is shown to process waves. FIG. 7 also illustrates this step, which can occur in connection with testing and or later use of wave device 100. In the example of FIG. 7, waves are directed at a second surface $104_{S2}$ of substrate 104, which is opposite surface $104_{S1}$ to which circuit die 102 is affixed (directly, or via intermediate structure, such as lead frame 106). Substrate 104 is preferably constructed of material(s) that permits the wave having a bandwidth $BW_D$ to pass through the substrate with reduced absorbance. Accordingly, as shown in FIG. 7, as the waves are directed to surface $104_{S2}$, the signals pass through substrate 104 and impinge upon the concave surface of wave shaping member 114. In this example, the waves are light and wave shaping member 114 is a parabolic reflector, so as a result the directionality of the incoming waves (or rays) is reflected to a different direction. Accordingly, for example, the earlier sublimatable form 112 is shaped and dimensioned, so that the confirming and resulting wave shaping member 114 will provide a desired change in directionality of the incoming wave, which in this embodiment is a reflective angle of incidence toward wave surface $102_{WS}$, as shown in FIG. 7. Moreover, after waves are reflected as described, they pass from the reflector to wave surface $102_{WS}$, via the communication channel of air that remains inside the concave region of member 114, with that channel having been earlier evacuated of the sublimatable material/gas. As a result, the reflected signal experiences zero loss, as the air through which it passes is a zero loss material. Lastly, while the directionality of the waves is shown in FIG. 7 for wave device 10 receiving a signal, if instead wave surface $102_{WS}$ provides a transmitting functionality, then the signal directionality is reversed, while the other benefits described hereinabove are still achieved. Accordingly, in such an instance, wave surface $102_{WS}$ may operate to transmit waves toward the inner concave surface $114I_{CS}$ of member 114, in which case such waves would then be reflected toward surface $104_{S1}$ of substrate 104 and then through substrate 104, thereby providing a directional transmission of such waves, such as toward or in the direction of an intended target or receiving device.

In view of the description hereinabove, an example methodology and structure result in a semiconductor wave device with an integrated wave signal directionality feature, so as to improve manufacturability, device longevity, and so as to efficiently communicate energy from the wave signal to/from the receiver/transmitter of the wave device. Other wave shaping members may be situated, relative to one more integrated circuit die, as formed adjacent or in conformity with a sublimatable form that is subsequently sublimated, leaving the wave shaping member affixed and encapsulated in the wave device package. Another example embodiment is described hereinbelow.

Figure 8:
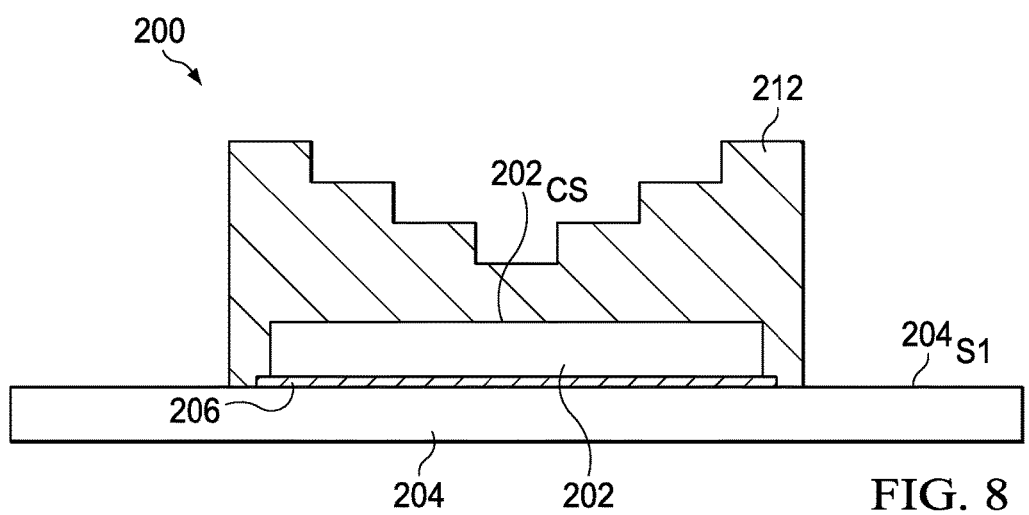
FIG. 8 illustrates a cross-sectional view of an alternative embodiment wave device.

FIG. 8 illustrates a cross-sectional view of an alternative embodiment wave device 200, which also may be constructed according to method 10 of FIG. 1, but which results in various different structural aspects. Accordingly, steps relating to method 10 are generally referenced hereinbelow, but their additional details are described hereinabove. Also, various illustrations and descriptions herein use cross-sectional views, which are helpful in understanding the overall device's three dimensions.

Referring to FIG. 8, the first step 12 of method 10 attaches a circuit die 202 relative to a first surface $204_{S1}$ of a substrate 204, where circuit die 202 may include apparatus and functionality for either transmitting or receiving (or both transmitting and receiving) a wave with bandwidth $BW_D$. Substrate 204 is constructed of various materials. But with respect to wave device 200, in contrast to the above-described device 100, the material of substrate 204 is not required to be transmissive to bandwidth $BW_D$, because the waves are not ultimately transmitted through that structure in this example embodiment. In any event, the attachment of die 202 relative to substrate 204 may include various techniques and structures, where FIG. 8 also shows such affixation with a first lead frame 206 first attached to substrate 204, and circuit die 202 attached adjacent lead frame 206. Although not shown from the cross-sectional perspective, additional lead frames also may be, and are likely to be, affixed to substrate 204, with conductors (e.g., bond wires) also connected between each such lead frame and respective conductive pads on die 202. Completing FIG. 8, step 14 of method 10 forms a shaped sublimatable material relative to a region of circuit die 202, and a sublimatable form 212 is created in this example, which is illustrated as having a stair-step profile. Form 212 may be created using various processes, including 3-D printing for example, where form 212 provides a precursor shape for forming an adjacent and shape-conforming structure next to the form, as further described hereinbelow.

Figure 9A:
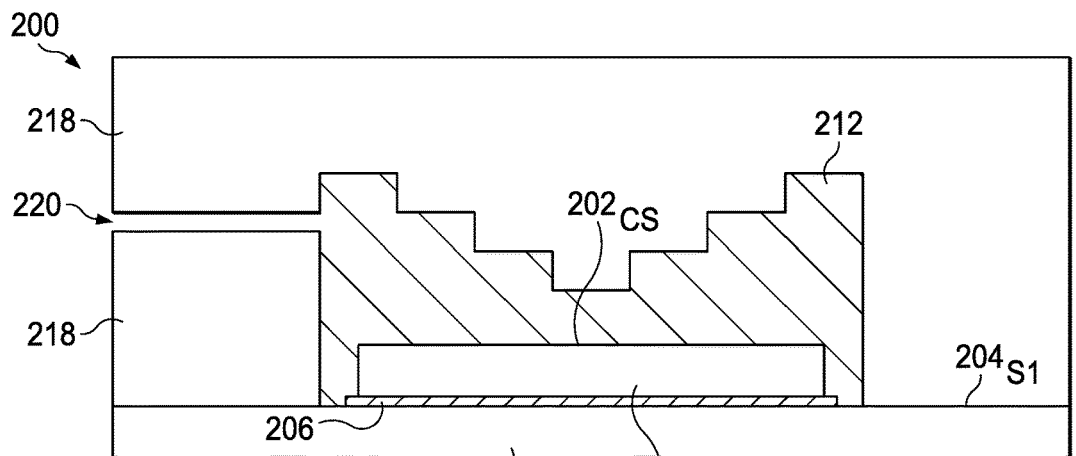
FIG. 9A illustrates the cross-sectional view of FIG. 8 after additional processing.

With respect to wave device 200, and as now introduced in the cross-sectional view of FIG. 9A, the FIG. 1 steps 16 and 18 are combined with respect to a single structure. More particularly, a conforming wave shaping member 218 (or plural members) is/are formed adjacent the sublimatable form 212. In this example embodiment, conforming wave shaping member 218 (step 16 of method 10) is an integrated circuit packaging material (step 18 of method 10) applied over the device, preferably so as to encapsulate the sublimatable form 212 and the remainder of the items affixed to substrate 204. For this step, FIG. 9A illustrates the cross-sectional view of FIG. 8, with the addition of an encapsulating molding material that therefore provides a wave shaping member 218, formed according to step 18 by applying a select molding material over the desired circuit components and performing any additional steps as may be required in connection with integrated circuit packaging. For the example device 200 of FIG. 9A (and Figures described hereinbelow), ultimately waves are to pass through the molding materials of member 218, akin to such waves passing through substrate 104 in the above-described device 100. Thus, for device 200, the molding materials(s) forming member 218 are selected with a consideration of the type and/or bandwidth $BW_D$ of the wave that is communicated relative to device 100, so that such materials readily permit the wave to transmit through member 218 with little or no change in the signal strength, so the molding material does not have strong absorbance in the bandwidth $BW_D$ of interest. Also in connection with FIG. 9A, a lateral aperture 220 is also created in fluid (e.g., air) communication with the sublimatable form 212.

Figure 10:
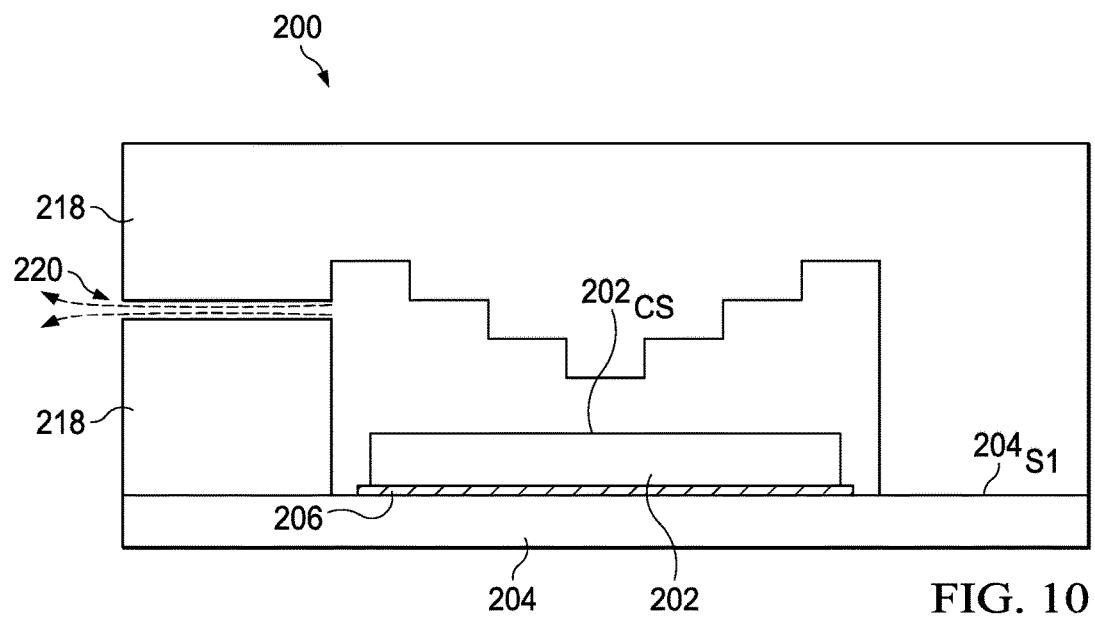
FIG. 10 illustrates the cross-sectional view of FIG. 9A after additional processing.

FIG. 10 illustrates the cross-sectional view from FIG. 9A, further demonstrating step 20 of method 10 as applied to device 200. Thus, FIG. 10 depicts that sublimatable form 212 from FIG. 9A is sublimated, again by process(es) to transition the substance directly from the solid to the gas phase without passing through the intermediate liquid phase. Accordingly, the sublimatable material encapsulated by encapsulating mold 218 turns to gas and is exhausted via aperture 220, as shown by dotted arrows in the Figure. Therefore, in a resulting device 200, an interior cavity remains relative to the surface of circuit die 212, and waves may propagate with little or no interference from the air in that cavity.

Figure 11:
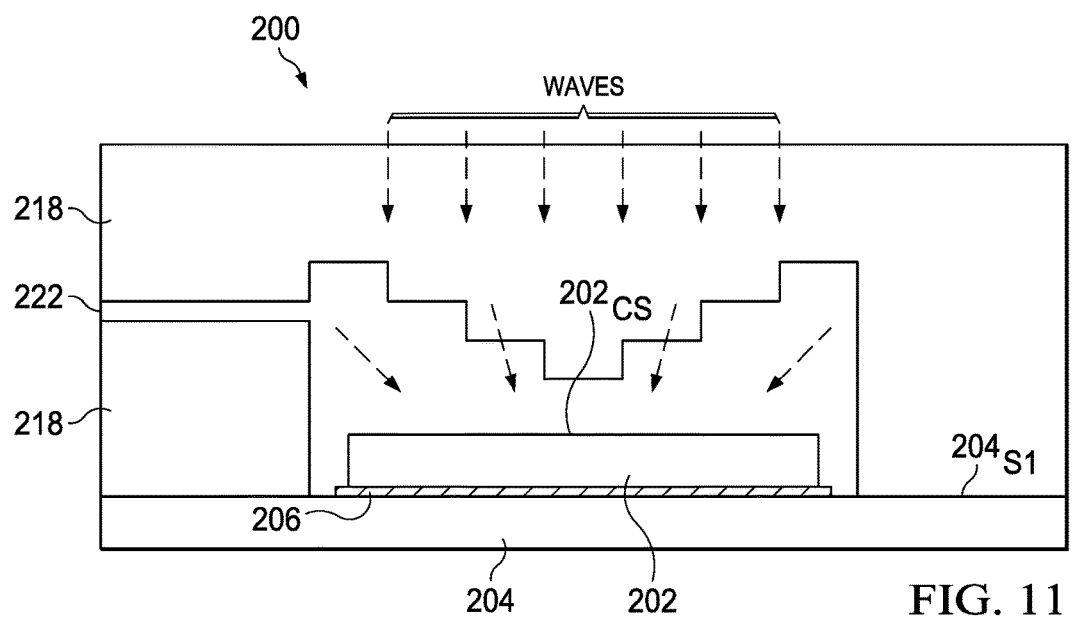
FIG. 11 illustrates the cross-sectional view of FIG. 10 after additional processing and in an operational illustration.

FIG. 11 illustrates the cross-sectional view from FIG. 10, further demonstrating steps 22 and 24 of method 10, as applied to device 200. As a first observation in FIG. 11, a cover 222 may be formed over the aperture 220 that was formerly in the packaging material, as shown in FIG. 10. Thus, cover 222 encloses any open cavity between encapsulating mold 218 and circuit die 202. As a second observation, FIG. 11 shows the final step 24 from FIG. 1 to process waves. Mold 218 comprises materials that readily permit the wave to transmit through it, with little or no change in the signal direction or strength. As a result, FIG. 11 shows such waves directed toward, and passing through, mold 218. However, the stair-step shape of mold 218 presents a surface facing circuit die 202 and thereby creates a refractive directionality of the waves, so as to focus or direct the waves more toward the communication surface $202_{CS}$ of die 202. For example, mold 218, either alone or in combination with the air interface from the cavity left behind after sublimation of form 212, again provides wave shaping directionality of the waves toward circuit die 202 (or, in an alternative embodiment, die 202 includes a transmitter, and such directionality may be achieved away from circuit die 202). In any event, therefore, mold 218 provides a lens, so as to change the direction of waves impinging on a first surface of the lens relative to the waves as they depart from a second surface of the lens.

Figure 9B:
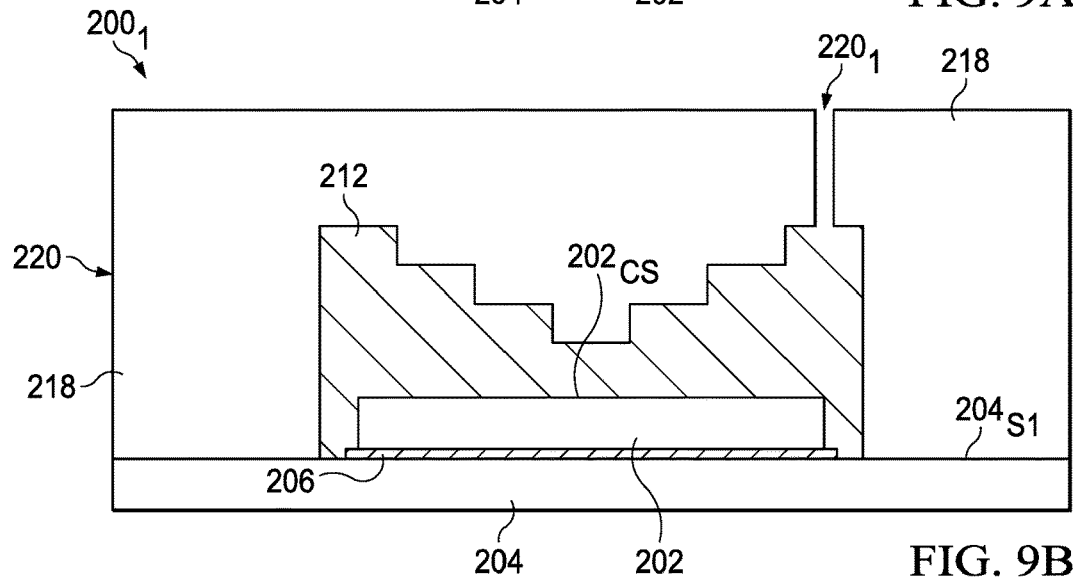
FIGS. 9B and 9C illustrate respective cross-sectional views of alternative embodiments to that shown in FIG. 9A.
Figure 9C:
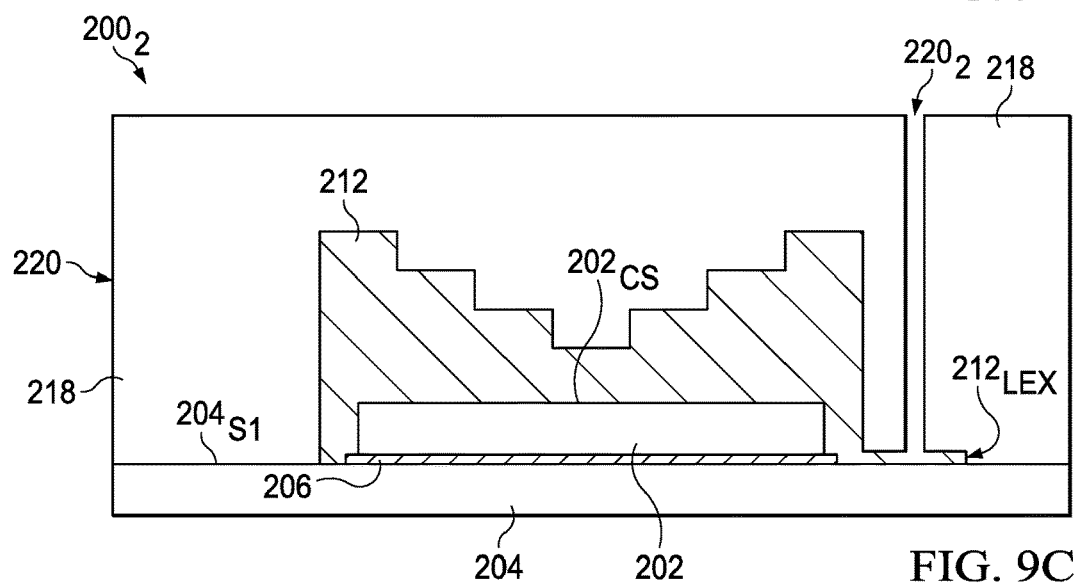

Having described the formation of device 200 and its operation, various alternatives are possible. For example, additional devices $200_1$ and $200_2$ are shown, respectively, in FIGS. 9B and 9C, where the process flow in those Figures is comparable to the stage of formation as described hereinabove in connection with FIG. 9A. With respect to both devices $200_1$ and $200_2$, in connection with device 200 of FIG. 9A, a laterally created aperture 220 may be difficult, infeasible or otherwise undesirable during certain process flows. Alternatively, therefore, devices $200_1$ and $200_2$ both include vertical apertures $220_1$ and $200_2$, respectively, as may be implemented in connection with both conventional molding processes and the above-described film assist molding approach. In device $200_1$, vertical aperture $220_1$ is positioned toward a far (e.g., right, as shown) vertical edge of sublimatable form 212, so as to serve the exhausting function described hereinabove, while still permitting a vertical implementation of the aperture through the integrated circuit packaging material wave shaping member 218. This positioning is desirable, because it reduces the effect (if any) that the remaining bore of the aperture could have on disturbing the path of waves to/from device $200_1$. However, as an additional example embodiment, FIG. 9C illustrates for device $200_2$ that form 212 includes a lateral extension $212_{LEX}$, so as to provide a path for aperture $220_2$ to be positioned even a greater distance laterally relative to communication surface $202_{CS}$. Thus, after aperture $220_2$ is closed (similar to cover 222 in FIG. 11) and device 2002 is subsequently operated, waves are less likely to be disturbed as emitted or detected by circuit 202, due to the additional lateral displacement accomplished via lateral extension $212_{LEX}$.

In view of the description hereinabove, various example embodiments provide improvements to: a method of creating; and a resulting integrated circuit wave device that communicates waves with a bandwidth that is minimally affected as the waves pass through an external portion of the device and are shaped internally of the device, either to or from an encapsulated integrated circuit die. Example embodiments may be created for waves of various bandwidths, with radio frequency (RF), visible light and/or infrared (IR) communication elements. Directionality and/or focus also may be used to a central point or to multiple points, such as with an array of sensors or transmitters. Further, such internal wave shaping is achieved by creating a form and an adjacent shape, where the form: is thereafter sublimated, leaving behind an air cavity and a wave shaping member; or is of a material that has at most a negligible effect on the bandwidth $BW_D$ of the waves passing through it. The wave shaping member may have many forms, such as lenses (e.g., Fresnel) or reflector shapes, where the shaping device may include singular or multiple such devices. Moreover, different example embodiments may be created for different respective bandwidths $BW_D$, and the device may thereby provide (or be incorporated into) numerous apparatus or applications, such as photodetctors/photosensors, cameras, range finders, focusing devices, targeting systems, automotive detectors and numerous others.

Modifications are possible in the described embodiments, and other embodiments are possible, within the scope of the claims.

What is claimed is:

1. A method of forming an integrated circuit wave device, the method comprising:
   affixing an integrated circuit die relative to a substrate;
   creating a form relative to the integrated circuit die and the substrate, the form comprising a removable material covering the integrated circuit die and at least a portion of the substrate;
   forming a wave shaping member over the form so that an inner surface of the wave shaping member that faces the integrated circuit die has a shape conforming at least in part to a shape of the form, and so that the wave shaping member has an aperture, wherein the wave shaping member comprises a lens comprising integrated circuit packaging material; and
   removing the removable material through the aperture.

2. The method of claim 1:
   wherein the wave shaping member is operable to shape a wave comprising a bandwidth; and
   wherein the step of creating a form comprises creating the form comprising a material with at most a negligible effect on the bandwidth.

3. The method of claim 1 wherein the step of forming a wave shaping member comprises forming a reflector.

4. The method of claim 1 wherein the step of forming a wave shaping member comprises forming the wave shaping member adjacent the form.

5. The method of claim 4 and further comprising forming an encapsulating integrated circuit packaging material adjacent the wave shaping member.

6. The method of claim 5:
   wherein the step of forming an encapsulating integrated circuit packaging material comprises forming the encapsulating integrated circuit packaging material having an aperture.

7. The method of claim 6 and further comprising sealing the aperture of the encapsulating integrated circuit packaging material after the removing step.

8. The method of claim 1:
   wherein the wave shaping member is operable to shape a wave comprising a bandwidth; and
   wherein the substrate comprises a material with at most a negligible effect on the bandwidth.

9. The method of claim 1:
   wherein the step of forming a wave shaping member comprises forming a lens comprising integrated circuit packaging material having the aperture.

10. The method of claim 1 wherein the step of forming a wave shaping member comprises forming a path comprising the aperture, wherein the path is laterally displaced from a side edge of the removable material.

11. The method of claim 1 wherein the step of creating a form comprises creating a form comprising a stair-step profile.

12. The method of claim 1 wherein the step of creating a form comprises 3D printing the form.

13. The method of claim 1:
   wherein the wave shaping member is operable to shape a wave comprising a bandwidth; and
   wherein the bandwidth comprises a radio frequency bandwidth.

14. The method of claim 1:
   wherein the wave shaping member is operable to shape a wave comprising a bandwidth; and
   wherein the bandwidth comprises an infrared bandwidth.

15. The method of claim 1:
   wherein the wave shaping member is operable to shape a wave comprising a bandwidth; and
   wherein the bandwidth comprises visible light bandwidth.

16. The method of claim 1:
   wherein the wave shaping member is operable to shape a wave comprising a bandwidth; and
   wherein the bandwidth comprises ultraviolet bandwidth.

17. The method of claim 1 wherein the integrated circuit comprises a transmitter or receiver.

18. The method of claim 1, wherein the inner surface defines an interior cavity that is substantially filled by the form.

19. The method of claim 1, wherein the inner surface is concave relative to the integrated circuit die.

20. An integrated circuit wave device, comprising:
   an integrated circuit die affixed to a substrate; and
   a wave shaping member disposed over the integrated circuit die and having an inner surface facing the integrated circuit die, the inner surface conforming at least in part to a shape of a form that was affixed to the substrate during manufacture of the integrated circuit wave device, wherein the inner surface defines an interior cavity formed by removing removable material through an aperture of the wave shaping member, wherein the wave shaping member comprises a lens comprising integrated circuit packaging material, and the integrated circuit die is affixed to the substrate within the interior cavity.

21. The integrated circuit wave device of claim 20, wherein the interior cavity separates the integrated circuit die from the inner surface.

22. The integrated circuit wave device of claim 20 and further comprising a seal on the aperture.

* * * * *